United States Patent
Carr et al.

(10) Patent No.: US 6,262,569 B1
(45) Date of Patent: *Jul. 17, 2001

(54) COMPUTERIZED SOLID STATE ENERGY METER TEST SYSTEM AND METHOD OF TESTING

(75) Inventors: John M. Carr; Donald W. Malackowski, both of Lafayette, IN (US)

(73) Assignee: Utility Test Equipment Company, West Lafayette, IN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/978,709

(22) Filed: Nov. 26, 1997

Related U.S. Application Data

(63) Continuation of application No. 08/347,495, filed on Nov. 30, 1994, now Pat. No. 5,821,742.

(51) Int. Cl.[7] .............................. G01R 35/04; G01R 1/36
(52) U.S. Cl. ................................... 324/74; 324/110
(58) Field of Search .......................... 324/74, 130, 73.1, 324/110; 702/85; 361/1

(56) References Cited

U.S. PATENT DOCUMENTS

| | | | |
|---|---|---|---|
| 4,523,248 | * 6/1985 | Schmale et al. ........................... | 361/1 |
| 4,646,003 | 2/1987 | Phillips . | |
| 4,751,654 | 6/1988 | Lyyra . | |
| 4,810,958 | 3/1989 | Mogi et al. . | |
| 4,837,304 | 6/1989 | Baer et al. . | |
| 5,077,671 | * 12/1991 | Leslie et al. ........................... | 324/73.1 |
| 5,079,707 | * 1/1992 | Bird et al. ............................ | 324/73.1 |
| 5,115,407 | 5/1992 | Bird et al. . | |
| 5,243,696 | 9/1993 | Carr et al. . | |
| 5,325,048 | * 6/1994 | Longini ................................. | 324/74 |
| 5,345,362 | * 9/1994 | Winkler ................................ | 361/681 |
| 5,469,049 | * 11/1995 | Briese et al. .......................... | 324/130 |
| 5,539,304 | * 7/1996 | Payne et al. ........................... | 324/74 |
| 5,805,014 | * 9/1998 | Price .................................... | 327/427 |
| 5,910,875 | * 6/1999 | Tian et al. ................................ | 361/1 |
| 5,912,534 | * 6/1999 | Benedict ................................ | 315/82 |

OTHER PUBLICATIONS

Advertising brochure, one page, double-sided, entitled TransData Series 2100 Meter Test Set published in 1992 by TransData, Inc.

Advertising brochure, two sheets, entitled Watthour Engineering Co., Inc. Portable Automated Test Kit without a date of publication by Watthour Engineering Co., Inc. This brochure was published prior to applicants' filing date.

* cited by examiner

*Primary Examiner*—Ernest Karlsen
(74) *Attorney, Agent, or Firm*—Brinks Hofer Gilson & Lione

(57) ABSTRACT

A portable energy meter test system for testing energy meters and other related instrumentation on-site is disclosed. The test system utilizes waveform generating circuitry to generate and transmit electrical waveforms to an energy meter to be tested, and sensing circuitry for sensing electrical characteristics corresponding to the transmitted electrical waveform. The test system includes a processor for evaluation and control of the testing procedure. A graphic touch screen is coupled to the processor for displaying information about the energy meter and for displaying test options to the user and allowing the user to control the testing process by touching the screen.

5 Claims, 11 Drawing Sheets

Microfiche Appendix Included
(13 Microfiche, 1154 Pages)

FIG. 2a
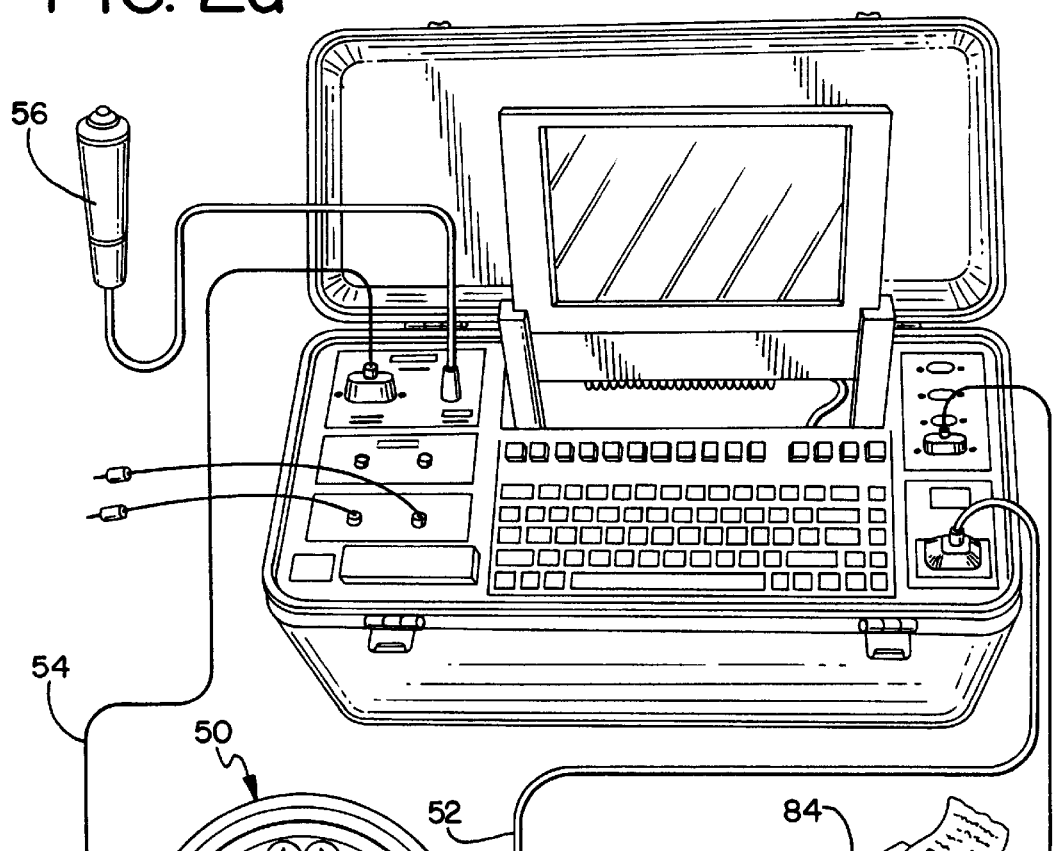
FIG. 2b
FIG. 2c
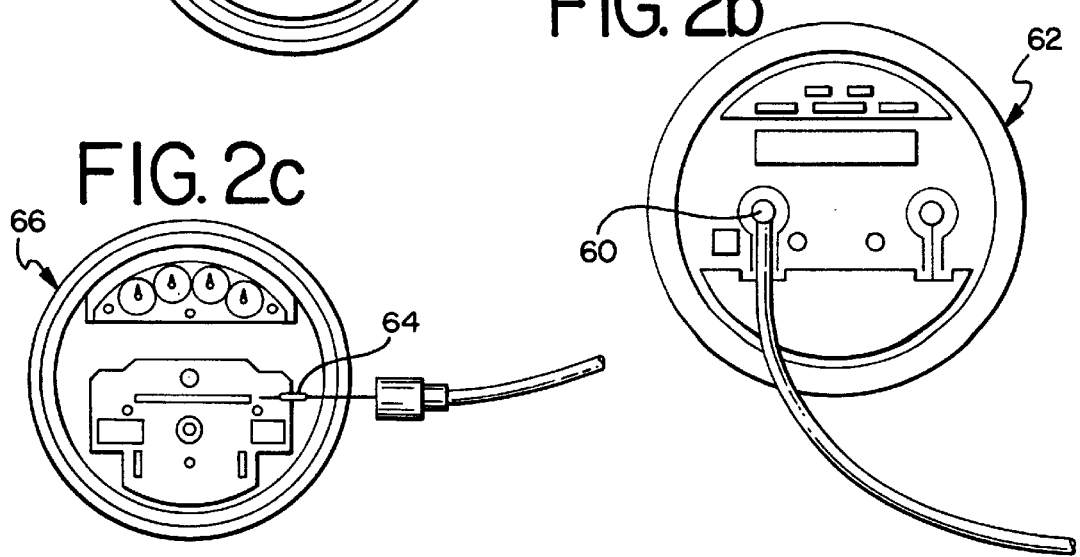

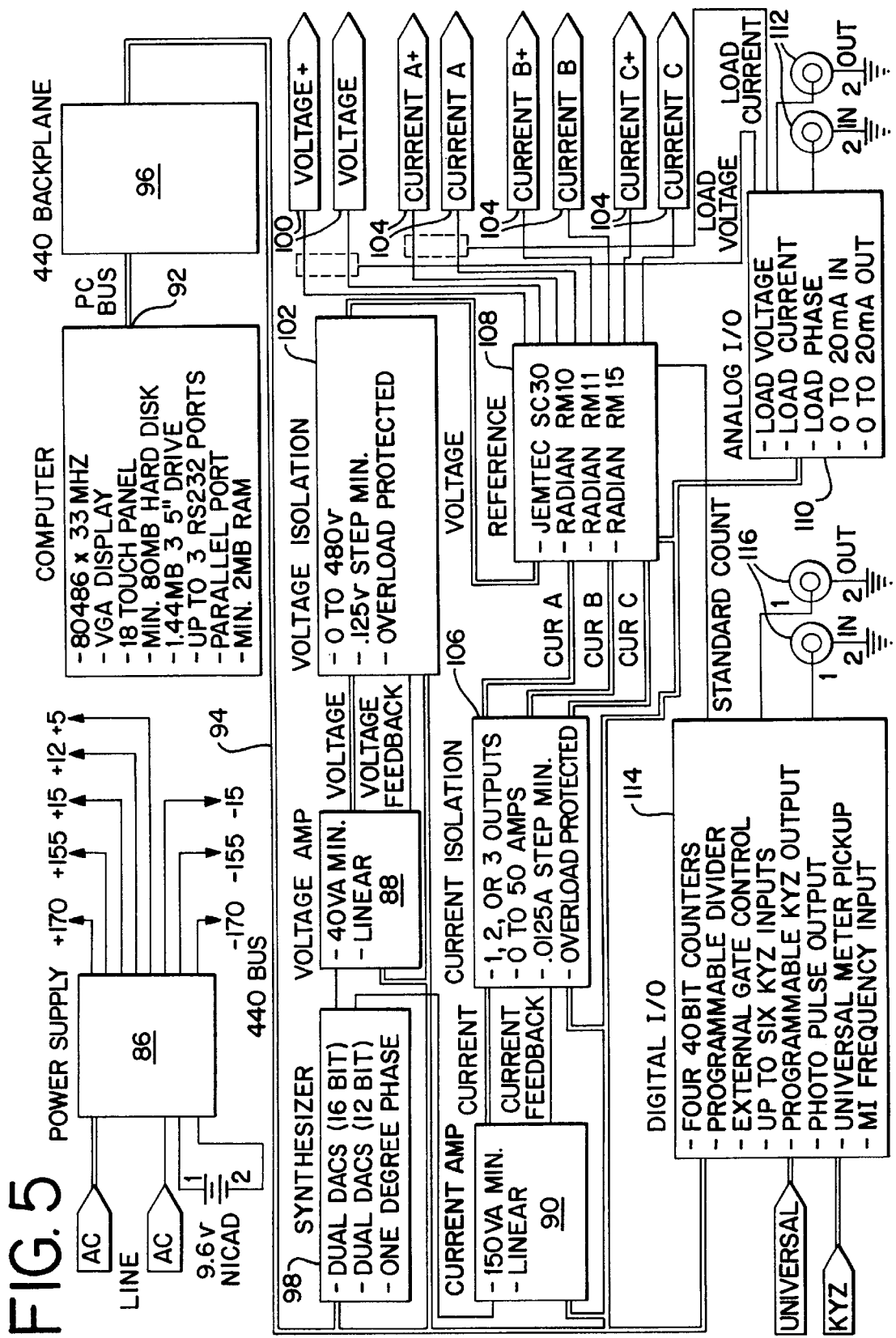

COMPUTERIZED SOLID STATE ENERGY METER TEST SYSTEM AND METHOD OF TESTING

This application is a continuation of application Ser. No. 08/347,495, filed Nov. 30, 1994, now U.S. Pat. No. 5,821,742

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Attached herewith as Microfiche Appendix A is a microfiche of 1083 pages of the computer program listing of the present invention. Appendix A contains 12 frames. Also attached herewith as Microfiche Appendix B is a microfiche of 71 pages of the schematic diagrams of the present invention. Appendix B contains 1 frame.

BACKGROUND OF THE INVENTION

The present invention relates to a method and system for testing energy meters and similar instrumentation and, more particularly, to an energy testing method and system that is computerized and portable.

Energy meters are meters used to measure and record energy, such as electricity, which is produced, used or sold. These meters are typically subject to state regulation and, accordingly, must have their accuracy and calibration certified on a regular basis. Various test methods and equipment or systems have been used to certify energy meters. It is desirable, however, that these test methods and systems are capable of performing many tests, are portable, safe to use, and easily adaptable for future needs and changes in certification requirements.

The certification of energy meters can be performed in a calibration laboratory or at the site where the energy meter is normally operated. When calibration is performed in the laboratory, larger scale, automated, safe and accurate test equipment is readily available. For testing at the energy meter use site, on the other hand, many problems exist with presently available testing methods and systems.

Without the availability of automated test equipment, such as used in calibration laboratories, portable test systems require many testing operations be performed manually by the testing technician. These manual operations require removing the cover from the energy meters, often exposing service voltages as high as 480 volts, and require the use of extreme safety precautions. One such precaution is the use of insulating gloves to protect the technician from shock. These gloves, although necessary, are often stiff and clumsy, and limit the technician's finger movements making it difficult to operate switches and computer keyboards.

There are a number of different types of energy meters and, in many cases, different connections are needed to test these meters. Existing portable test systems do not provide to the test technician information pertaining to these connections. Existing portable test systems also do not perform all of the necessary tests requiring test technicians to carry around extra equipment.

While testing energy meters at their use site, existing portable test systems are powered from the service voltage at the site. The test voltages, currents, and phase angles therefore contain all of the amplitude variation, phase variation, noise and distortion existing in the service voltage source.

Furthermore, existing portable test systems are highly limited and inflexible for future changes in test requirements. These test systems cannot be customized to respond to changing requirements or changing equipment. Existing art and known developed equipment do not provide adequate capabilities for solving these and other associated problems with the testing of energy meters.

SUMMARY OF THE INVENTION

A portable computerized and highly functional test system and method for testing energy meters is disclosed. The test system is more compact, lighter weight and more functional than prior systems, and therefore, overcomes the problems associated with prior test systems. The computer base facilitates ease of control, data management, and training, with a graphical software and a touch screen for ease of operation even with insulated gloves.

The test system of the present invention also contains solid state devices that generate voltages, current and phase angle digitally free of amplitude variation, phase variation, noise and distortion; thereby removing the energy meter completely from the influence of the service voltage. The test system virtually eliminates the differences between the calibration laboratory and current on site test systems.

The test system of the present invention further includes a computerized solid state energy meter that can accept a wide range of input voltages without damage to the equipment or injury to the test technician. By utilizing a wide voltage input power supply which can receive most power system voltages, the test technician need only connect the power input cable to the service without regard for the voltage level. These requirements are achieved by utilizing multiple switching devices with staggered drive signals.

The test system of the present invention contains software programmable logic which provides an almost unlimited number of variations of control logic. This logic can be software designed to accommodate any new control requirements. The test circuits are also software configurable which provides for an almost unlimited number of variations of testing procedures.

The test system of the present invention provides self-test capabilities and the ability to provide data for remote diagnostics via modem. Resident software capable of monitoring the operating functions and configurations of the test system can report the operating levels and the test definitions.

Other advantages and benefits of the present invention will become known to the artisan through study of the following descriptions, the attached drawings, the instructions and schematics found in the Appendices, and the definitions and claims which follow.

BRIEF DESCRIPTION OF THE DRAWINGS

Preferred embodiments of the invention are explained below with references to the accompanying drawings in which:

FIG. 2a illustrates the preferred embodiment of the energy meter test system connected to an energy meter according to the present invention.

FIGS. 2b and 2c illustrate other types of energy meters.

FIG. 5 illustrates a functional block diagram of the energy meter test system according to the present invention.

DETAILED DESCRIPTION OF THE PREFERRED EMBODIMENT

Figure 1A:
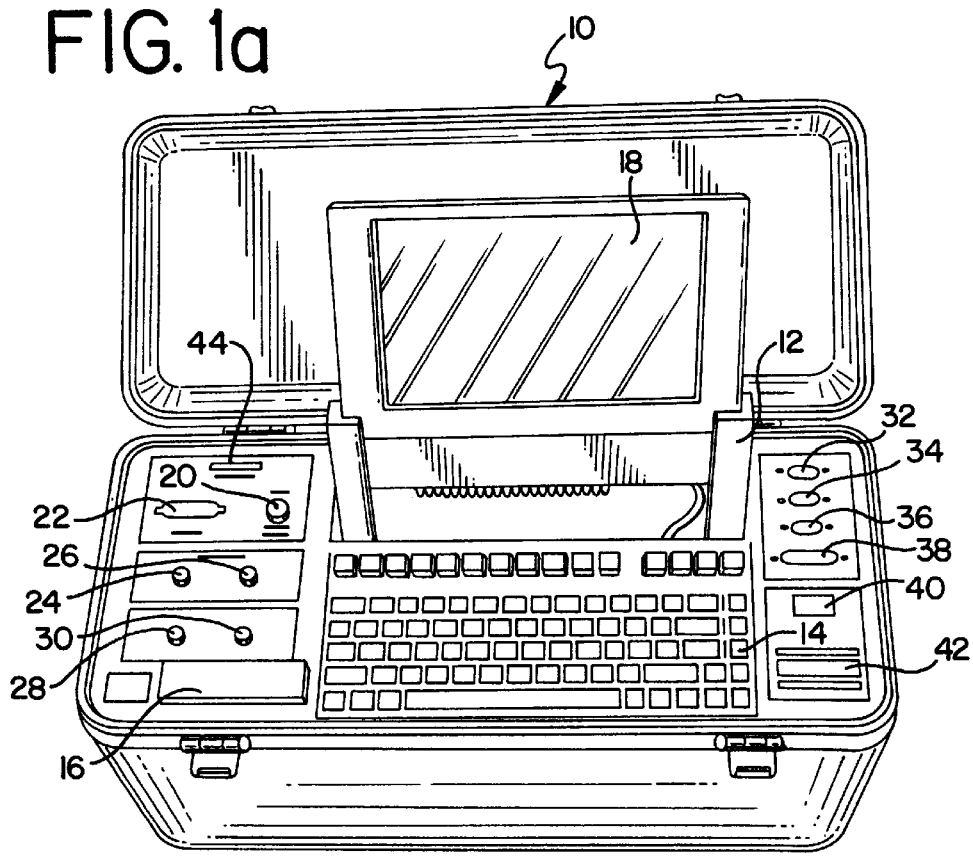
FIGS. 1a and 1b illustrate the preferred embodiment of the energy meter test system according to the present invention.

FIG. 1a illustrates a computerized solid state energy meter test system 10 according to a preferred embodiment of the present invention. The test system 10 is used to test energy meters such as electricity meters. FIG. 1a illustrates the test system 10 opened to its operational state. In the operational state, the front panel is exposed to the technician. Built into the test system 10 is a computer 12. Since the computer 12 is built into the test system, the test technician who needs a computer loaded with the appropriate software (and outfitted with the proper data acquisition devices), in order to perform the programming or data acquisition of the solid state energy meter, does not have to carry a computer separately, or find a work surface on which to place the computer.

The computer 12 includes a rugged fully removable keyboard 14, which is provided with a polyurethane keyboard cover (not shown). Since most sites are in restricted spaces, typically in open and dirty or muddy fields, the polyurethane cover protects the keyboard from dirt and water damage while testing is taking place.

Testing an energy meter may include certification, calibration, programming, evaluating or reading the energy meter or some other metering devices. Testing may also include communicating test results from the test system 10 out through a communications port to, for example, a printer. Testing may also include storing the test results or other data onto a storage device such as a hard drive (not shown) or a floppy disk drive 16. Further, testing may include programming or self-testing the test system 10 itself.

The test system 10 utilizes hardware circuitry that is, for the most part, known throughout the industry. The schematics for the test system hardware has been included herewith as Microfiche Appendix B.

The test system 10 features programmable logic which can be software designed to accommodate any new control requirement. This feature provides for an almost unlimited variation of control logic. The test circuits are also software configurable providing for multiple variations of testing procedures. The test system 10 can therefore easily adapt for testing new energy meters as well as new testing requirements for existing energy meters.

The computer 12 utilizes a VGA display and an infrared touch screen 18 as both an input and an output interface. A technician can select a function utilizing the infrared touch screen 18 by touching at or near the surface of the display 18. Shown here is a display utilizing infrared beams, however, many different types of touch screen displays are available, such as resistive, capacitive and sonic touch screen displays, all of which can be used in this application. A technician wearing insulated safety gloves can make a program selection without removing his safety gloves, thus increasing the technician's level of safety.

Also located on the front panel is a disk drive 16. The drive, which has a spring loaded cover to keep out dirt and other foreign objects, allows the technician to transfer data and programs to and from the test system 10.

The front panel of the test system 10 provides the input and output connectors to interface the test system 10 to the energy meter or other metering device to be tested and to the service voltage.

These I/O connectors include the universal interface connector 20 which is the input connector for the hand switch and photo heads. The KYZ interface connector 22, a 25 pin sub-D with male pins, is the input for the six channels of KYZ input and the one channel of KYZ output. Also included on the front panel are digital I/O BNC connectors. The IN BNC connector 24 provides a programmable pull-up resistor (not shown) for open collector outputs of other devices. The OUT BNC connector 26 can be programmed in the energy meter test system software to transmit many of the internal pulses such as the reference standard output. Voltages up to 20 volts DC at currents up to 100 MA may be used. Also located on the panel are the analog I/O BNC connectors. The IN BNC connector 28 accepts inputs of DC current from zero to 20 mA. The internal circuit resistance is 250 ohms. The OUT BNC connector 30 is a programmable constant current source which will deliver from zero to 20 mA DC.

Located on the upper right corner of the front panel are the communication ports of the energy meter test system 10. These communication ports include COM port A 32, COM port B 34 and COM port C 36. Also included is a parallel port 38. In the lower right corner of the panel is the power switch 40 and the test cable connector 42.

The test cable connector 42 is a heavy duty connector with six current leads, two voltage leads and two auxiliary power leads. The six current leads provide a current circuit for phases A, B and C. The test currents are generated by the energy meter test system 10 and do not originate with the service voltage. The two voltage leads provide the test voltage for the meter to be tested. Unlike other load designs which derive the test voltage from the service voltage the energy meter test system 10 generates the test voltage. The two auxiliary power lead connectors provide the capabilities for connecting the service voltage to power the energy meter test system 10.

For technician protection, the front panel of the test system 10 contains a warning light 44 which signals when a test voltage is present.

The energy meter test system 10 contains self-testing capabilities and also can provide data for remote diagnostics via a modem (not shown). Resident software capable of monitoring the operating functions and configurations can report operating levels and test definitions.

The test system 10 contains both production and engineering software. The production software consists of pre-defined standard energy meter tests and the engineering software provides the ability to select testing parameters in small steps for performing non-standard tests.

New types of solid state electricity meters are computerized and require programming. For example, one of the items that can be programmed is the pulse value of the pulse initiator output. Once programmed, it is not visibly apparent to the test technician what the programmed value of the pulse output is, therefore, an electricity meter programming device must be attached to determine the pulse value should it not be known. This requires additional test time and in many cases, the programming device is not at the test site causing additional delays. The test system 10 contains software and circuitry for determining the value of the pulse initiator output by testing the energy meter.

Further some solid state energy meters are fitted with data input/output ports through which the energy meter can be interrogated for information such as type of meter, serial number, date of last calibration, measured values and energy measurement type selected (watthour, varhour, Qhour, etc.). The test system 10 utilizes this data port control by transmitting to and from its communications ports. The test system 10 contains hardware and software to utilize this feature.

Current energy meters are tested for accuracy and if necessary brought into calibration compliance with manual adjustments using conventional tools and electronic components. However, future generation energy meters will be fitted with a communications port such that a dialogue will be created between the energy meter and the test system. Once this communication link exists, the energy meter will be able to request test result from the test system, calibrate itself, and request another test to ensure calibration compliance. The test system 10 is designed to communicate and interactively calibrate future generation energy meters.

Figure 1B:
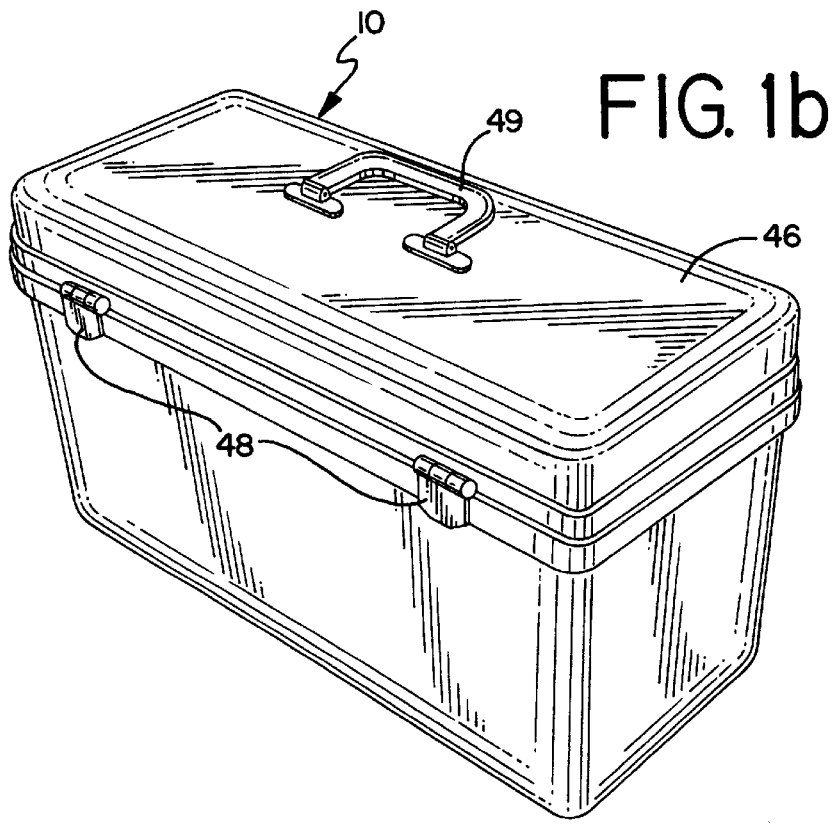

FIG. 1b illustrates the test system 10 in its non-operational transportable state. The test system 10 is housed in a protective case 46 that can be closed and locked via locking latches 48. The test system 10 can then be carried by the handle 49. The case 46 also serves to protect the test system 10 from dirt and other foreign objects found at the site or during transit.

FIG. 2a illustrate the necessary testing connections between the test system 10 and an energy meter 50. To operate the test system 10 at the operational site location, the test technician initially isolates the service from the energy meter 50 to be tested. The test technician then connects the portable energy meter tester 10 to the service voltage by first connecting the test cable 52 to the test cable connector 42. Next, the test technician connects the test cable 52 to the energy meter 50 and the service voltage (not shown). The technician then connects the KYZ cable 54 from the test system 10 at the KYZ interface connector 22 to the energy meter 50. The test system 10 is now able to generate and transmit electrical waveforms to the energy meter 50, and, using its Internal circuitry (not shown), sense the electrical characteristics from the energy meter 50 corresponding to the transmitted electrical waveforms. Although not shown, the test system internal circuitry utilized as a sensor in this application, is known throughout the industry by anyone having ordinary skill in the art. Further, although different circuitry is used for different types of energy meters and different types of testing, the schematics representing the circuitry for this preferred embodiment can be found in Microfiche Appendix B.

As stated above, there are many other methods of testing an energy meter. Testing may be accomplished using a hand switch 56 by connecting the hand switch 56 to the universal interface connector 20. During testing, the hand switch is depressed by the test technician upon each rotation of the meter wheel 58.

FIG. 2b illustrates another type of testing. A photohead 60, which can be connected to the universal interface connector 20, can gather information pertaining to certain energy meters 62. This information is then sensed by the test system 10. In some cases, the photohead 60 utilizes a suction cup to connect it to the energy meter 62 for testing.

FIG. 2c illustrates yet another type of testing. Using a light pulse 64, information pertaining to the energy meter 66 can be detected and sensed by the test system 10.

Figure 3A:
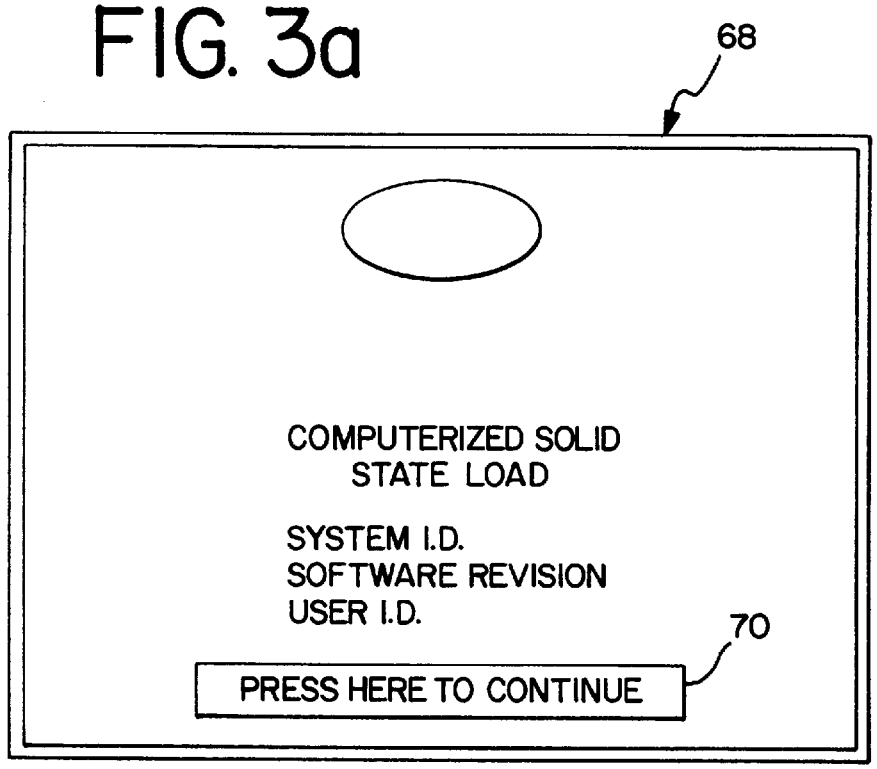
FIGS. 3a and 3b illustrate examples of graphical touch screen menus as viewed by the test technician.
Figure 3B:
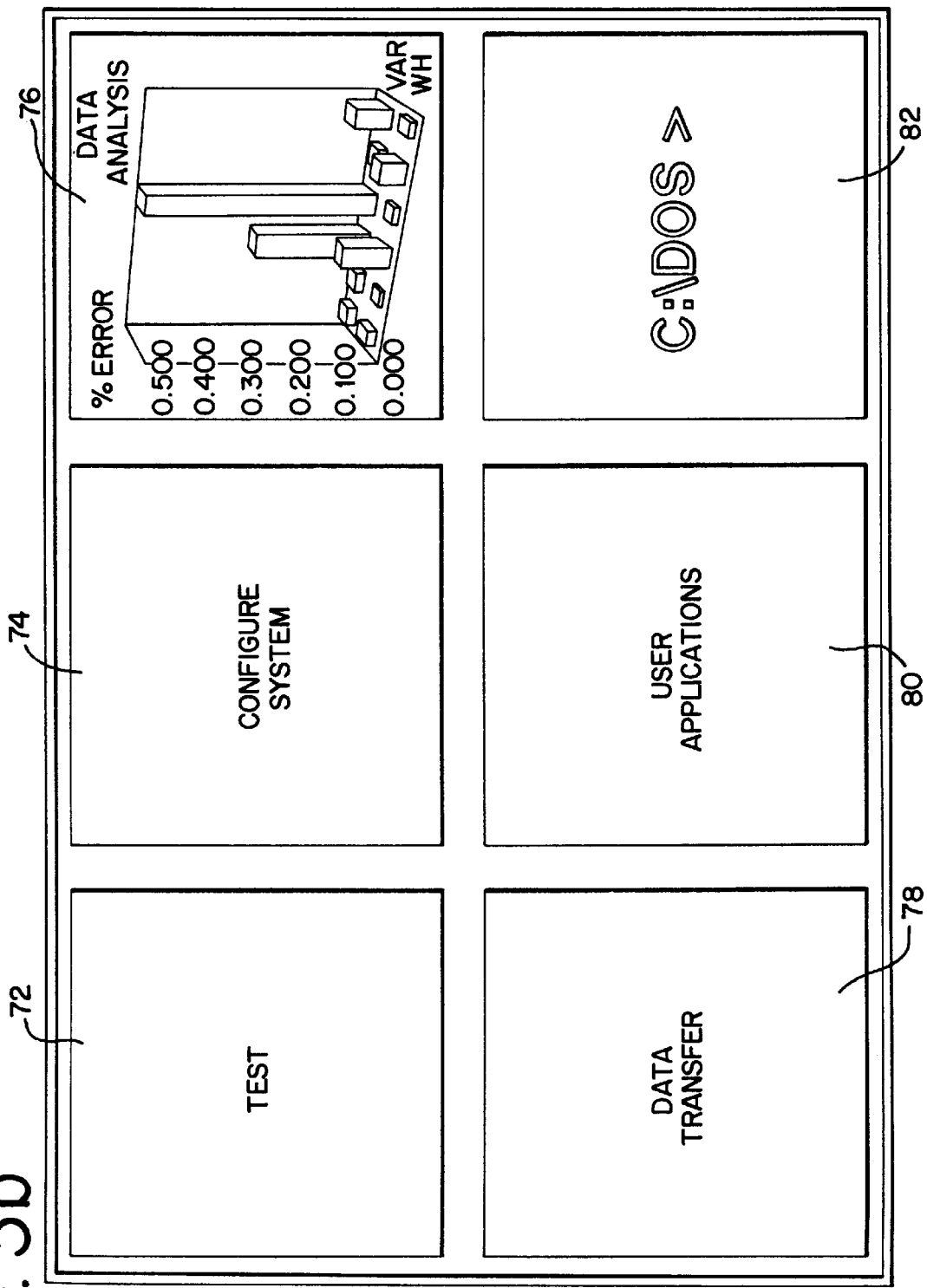

Using the computer 12 and the touch screen 18 interface, the technician can access the different test options provided by the resident software. As the technician proceeds, different graphical menus will appear on the touch screen. By touching the screen (or on some devices, in near proximity to the screen), the technician can decide what test to run. FIG. 3a illustrates the graphics screen 68 encountered by the test technician upon turning on test system 10. The test technician can touch the screen in the box 70 to advance the program. FIG. 3b illustrates an example of a graphical menu that the technician will encounter during testing. On the screen of FIG. 3b the technician can decide to enter the test subroutine 72, configure the system 74, analyze data 76, transfer data 78, enter the user applications routine 80, or exit to the disk operating system (DOS) 82. Depending on the technician's choice, a different subroutine will run and different graphical menus will be encountered by the technician.

By touching the screen, the technician can choose a test option and begin transmitting electrical waveforms from the test system 10 to the energy meter 50 through the test cable 52. The energy meter 50 will transmit electrical characteristics back to the test system 10, through KYZ cable 54, corresponding to the transmitted electrical waveforms. The test system 10 will then sense these electrical characteristics from the energy meter 50, thereby effectuating the testing of the energy meter 50.

Whether testing is accomplished via a hand switch 56, a photohead 60, a KYZ cable 54 or by pulse 64 an electrical characteristic is sensed by the test system 10.

In order to perform the energy meter testing, the test technician must access the current and voltage circuits of the energy meter. These two metering circuits are impedance opposites, the voltage circuit is high impedance and the current circuit is a low impedance, that can be characterized as a short circuit. The current source of the testing equipment is also a very low impedance that can also be characterized as a short circuit. If the current output circuit of the testing equipment is accidentally connected to the service voltage, the service voltage will short resulting in equipment damage and possibly injury to the test technician.

In order to protect from this type of equipment damage or injury, the test system 10 utilizes circuitry that monitors the voltage and current test sources for back feed voltage. The source circuits are electrically isolated from the output terminals of the instrument. If the circuits detect a back feed voltage on the instrument output terminals, the circuitry locks the source circuits in the isolated condition until the fault is removed.

Furthermore, by using full electronic protection of the testing and operating circuits for over burden, short circuits, open circuits and over temperature, the problems associated with fuses and circuit breakers (thermal devices requiring several cycles of fault current before opening and clearing the fault), are resolved.

Figure 4A:
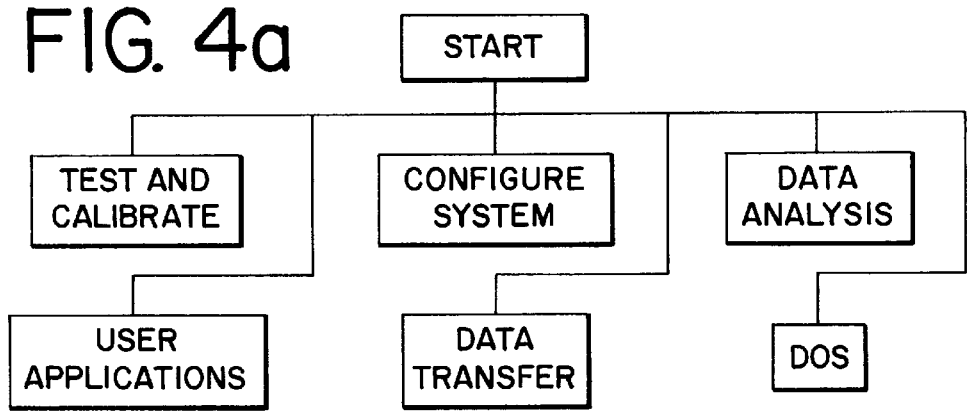
FIG. 4a illustrates a flow chart of the preferred embodiment of the main menu of the energy meter test system according to the present invention.

FIG. 4a illustrates the flow chart of the main menu as viewed by the test technician during operation of the test system 10. The main menu will appear on the display as shown in FIG. 3b. By touching the screen at or near the desired location, the test technician can select a particular test option subroutine from the main menu.

Figure 4C:
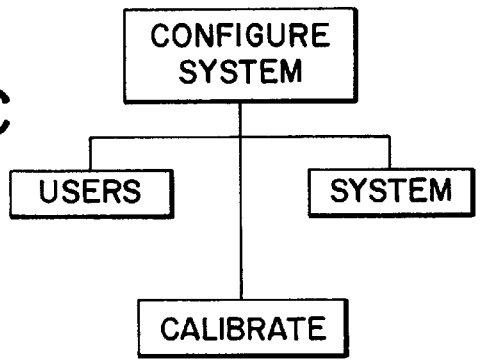
FIG. 4c illustrates a flow chart of the preferred embodiment of the configure system menu routine of the energy meter test system according to the present invention.
Figure 4D:
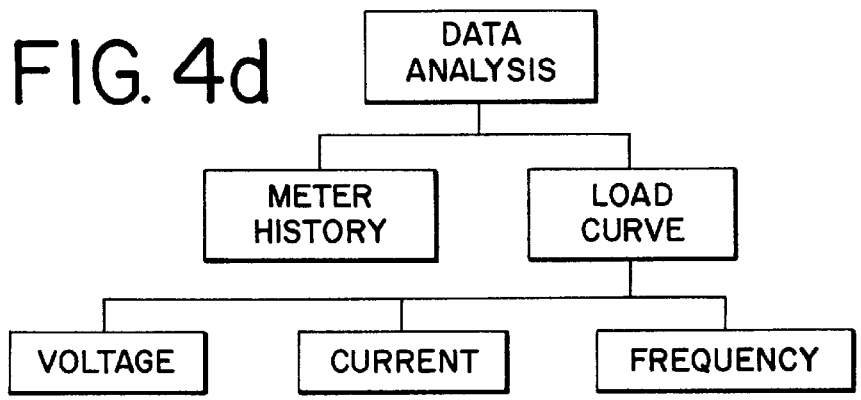
FIG. 4d illustrates a flow chart of the preferred embodiment of the data analysis menu routine of the energy meter test system according to the present invention.
Figure 4E:
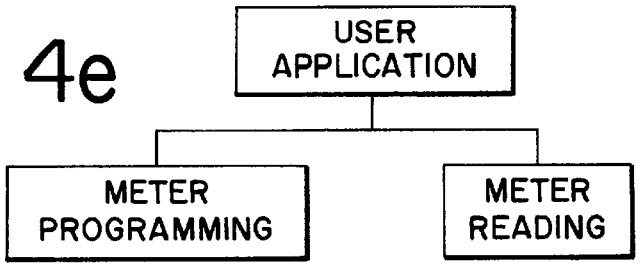
FIG. 4e illustrates a flow chart of the preferred embodiment of the user applications menu routine of the energy meter test system according to the present invention.
Figure 4B:
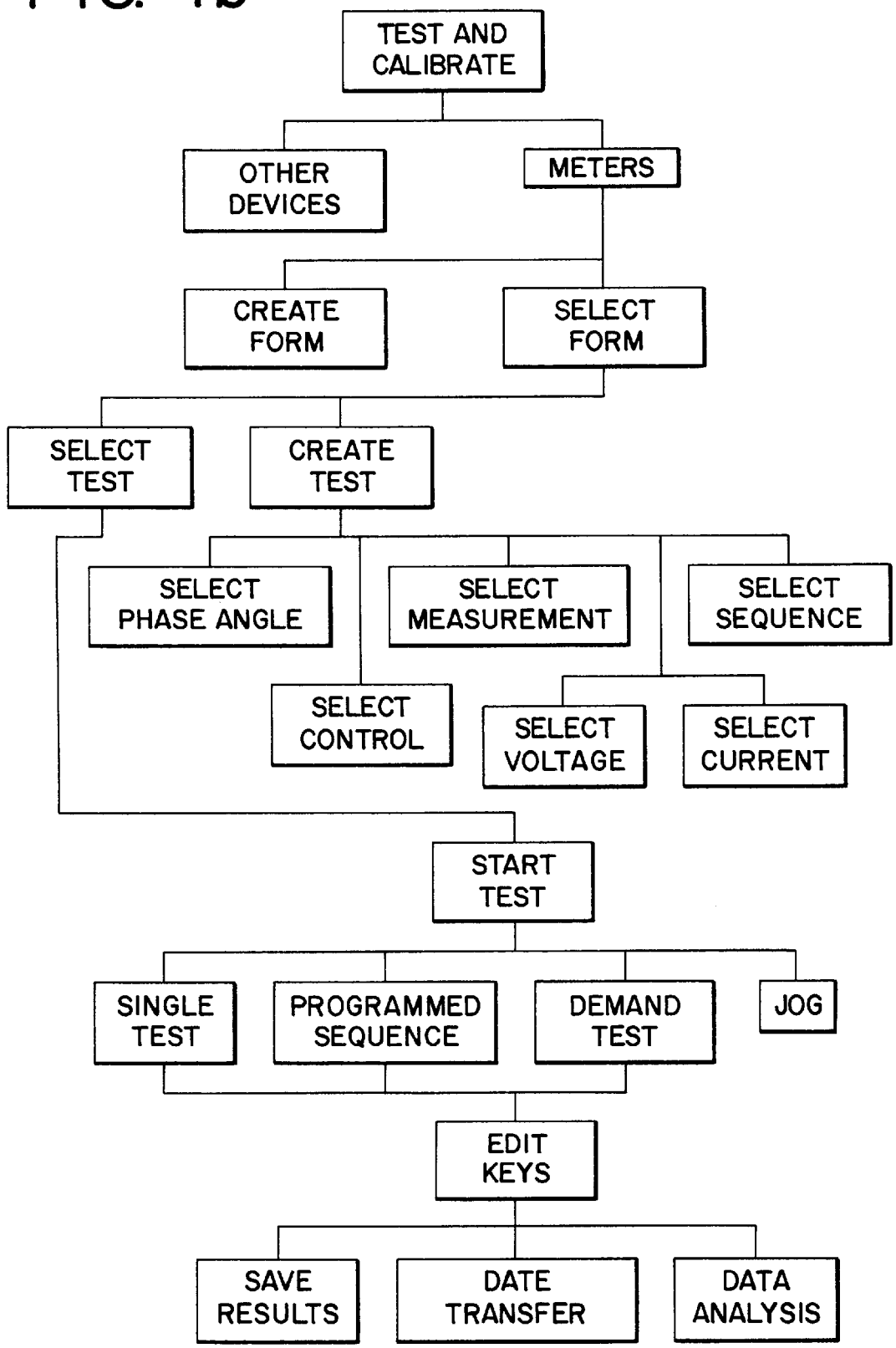
FIG. 4b illustrates a flow chart of the preferred embodiment of the test and calibrate menu routine of the energy meter test system according to the present invention.

FIG. 4b illustrates the test and calibrate subroutine. The subroutine initially allows the test technician to test and calibrate either energy meters or other metering devices. The test technician has the option of using existing tests or creating a new test. To create a new test the test technician must select the voltage, current, phase angle along with the measurement, sequence and type of control. Once the test technician begins the testing, he can decide whether a single test will run or he can program which tests to run and what order they run in. Once the testing is complete, the test technician can save the test results to a storage device such as a hard drive or a floppy disk, analyze the test results and/or transfer the test results via the communication ports to, for example, a printer 84 (FIG. 2a).

FIGS. 4c, 4d and 4e illustrate the configure system routine, the data analysis routine, and the user application routines, respectively. Once in these routines the technician is able to perform such functions as calibrating or configuring the test system 10, reviewing the history of a particular meter or reading or programming a particular meter.

Figure 4F:
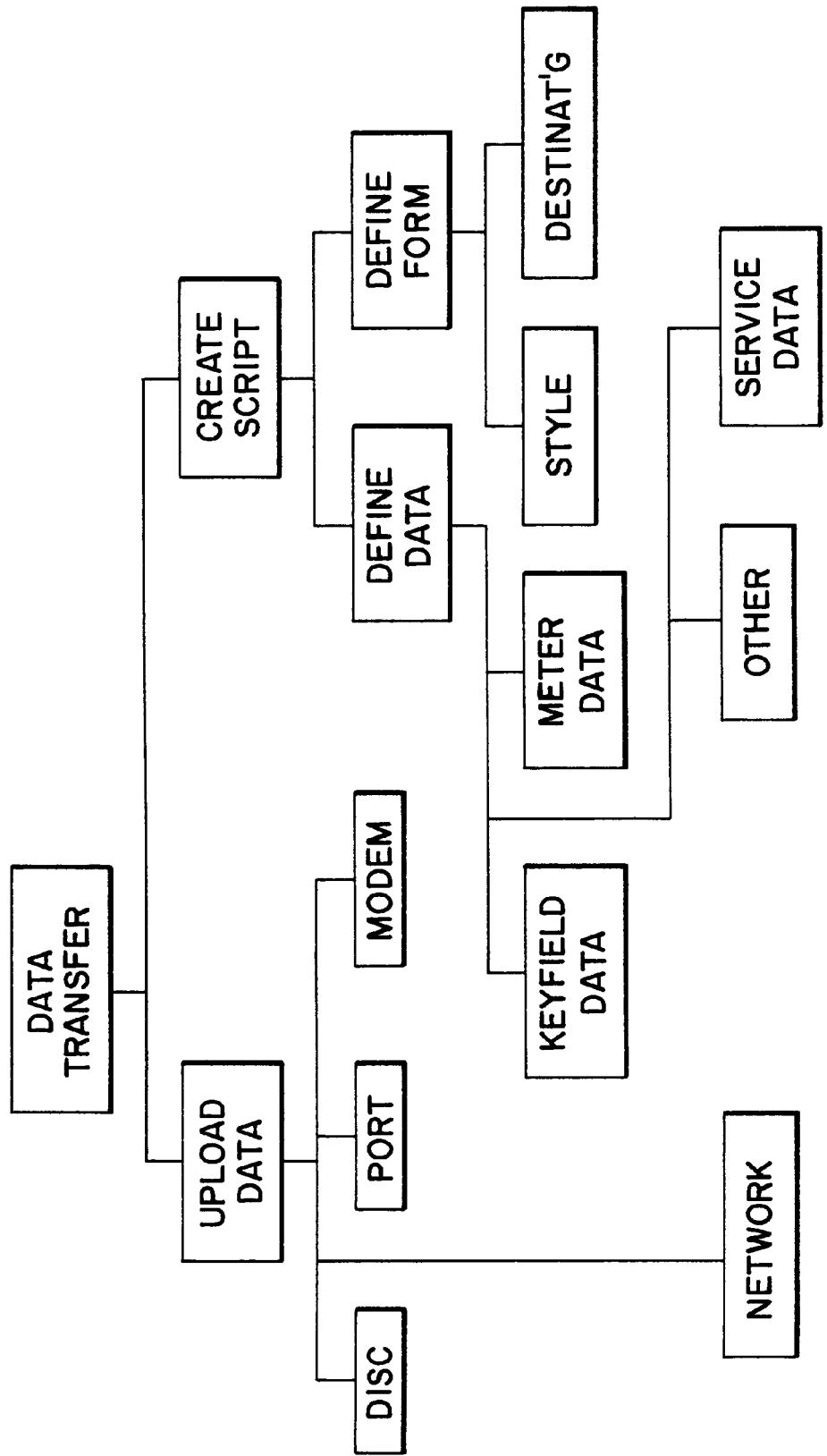
FIG. 4f illustrates a flow chart of the preferred embodiment of the data transfer menu routine of the energy meter test system according to the present invention.

FIG. 4f illustrates the data transfer routine. Inside the routine, the technician can create scripts and transfer information to internal disk out through a modem or through the communication ports.

FIG. 5 shows a block diagram of the energy meter test system 10. The power supply 86 is a wide, universal input power supply operating from a service voltage which may range over 500 volts AC or DC. This power supply 86 can receive all power system secondary voltages. The test technician need only connect the auxiliary power cable to the service without regard for the service voltage level. The power supply 86 will then provide the various DC voltages used in the energy meter test system 10. The power supply 86 also provides the bulk power to the voltage amp 88 and current amp 90 that provide the power to be applied to the energy meter during a test, or in the testing of other related metering instrumentation.

The test system 10 utilizes a computer 12 for controlling the testing of an energy meter. Testing may include certification, calibration, evaluation, programming, self-testing, communication, data transfer and storage. The test system 10 utilizes a PC compatible computer such as an IBM or a Compaq. In the preferred embodiment, the computer 12 contains a 80486 microprocessor running at 33 MHz with a VGA display and an infrared touch panel 18. The storage capabilities of the computer 12 include a minimum eighty megabyte hard disk drive, a minimum of 2 megabytes of Random Access Memory (RAM), and a 1.44 megabyte 3½ inch floppy disk drive 16, the latter for easily transporting software and data into and out of the computer 12. The computer 12 also houses the microprocessor code or software which it utilizes to run the various tests in its memory. A microfiche copy of the microprocessor code is attached as Microfiche Appendix A.

The test system 10 stores in its memory graphic wiring information with complete line by line written instruction and provides that information to the technician via the computer screen. There are more than 25 different types of energy meters each having different connection requirements for testing. The test system 10, by storing the necessary information in the computer memory and making it available to the technician at the time of testing, helps ensure proper connection for testing energy meters.

The computer 12 contains up to three RS232 ports and a parallel port to allow the transfer of data, printing and other forms of communications. The RS232 ports utilize a DB-9 male COM port connectors with pin assignments as follows:

| | |
|---|---|
| Pin 1 - DCD | Pin 6 - DSR |
| Pin 2 - RXD | Pin 7 - RTS |
| Pin 3 - TXD | Pin 8 - CTS |
| Pin 4 - DTR | Pin 9 - RI |
| Pin 5 - GND | |

The parallel port utilizes a DB-25 female PARALLEL port connector with pin assignment as follows:

| | |
|---|---|
| Pin 1 - STB | Pin 10 - ACK |
| Pin 2 - PD0 | Pin 11 - BUSY |
| Pin 3 - PD1 | Pin 12 - PE |
| Pin 4 - PD2 | Pin 13 - SLCT |
| Pin 5 - PD3 | Pin 14 - AFD |
| Pin 6 - PD4 | Pin 15 - ERR |
| Pin 7 - PD5 | Pin 16 - INIT |
| Pin 8 - PD6 | Pin 17 - SLIN |
| Pin 9 - PD7 | Pin 18–25 - GND |

The computer 12 interfaces to the rest of the test system 10 through its PC BUS 92 which is connected to the 440 BUS 94 through the 440 BACKPLANE 96. The 440 BUS 94 then connects to all the major components of the test system 10. In this manner, the computer 12, via its resident software, can control each component of the test system 10 and all aspects of testing.

The computer 12 is connected through the 440 back-plane 96 to the synthesizer 98. The synthesizer is a waveform generating device containing two 16 bit digital to analog converters (DAC) used for waveform generation and two 12 bit DACs used for waveform amplitude control. The waveform generating DACs receive digital information from a field programmable gate array (FPGA) to produce two precise sinewave waveforms, one representing voltage and one representing current. Each of the two waveforms contain 1920 data points that make up one cycle of the waveform. The FPGA can control the phase angle between the two waveforms produced from the 16 bit DACs from 0 to 360 degrees in 0.1875 degree steps. The FPGA also controls the amplitude of the two waveforms by sending digital information received from the computer 12 to the two 12 bit DACs. The amplitude of the waveforms can be controlled from 0 to 8.533 volts in 2.083 millivolt steps.

The waveform from the synthesizer 98 representing voltage is sent to the voltage amplifier 88. The voltage amplifier 88 amplifies the signal from the synthesizer 98 in both amplitude and power. The voltage amplifier has a fixed voltage gain of 12.5. This voltage gain will allow the output of the voltage amp to range from 0 to 106.6 volts in 26.04 millivolt steps. The output stage of the voltage amplifier is made up of multiple power MOSFET transistors to provide the power for the output voltage. The voltage amplifier also incorporates fold-over current limiting to provide against overloads and short circuits. The output power of the amplifier is set to a minimum of 40 VA. The voltage amplifier 88 also incorporates an error amplifier that compares the signal coming from the synthesizer 98 to a feedback signal coming from the output 100. The error amplifier will then adjust the gain and phase of the voltage amplifier to eliminate any gain, phase, or distortion errors in the output voltage signal 100.

The amplified synthesizer 98 voltage signal from the voltage amplifier 88 is then connected to the voltage isolation and ranging transformer 102. In addition to providing electrical isolation, the voltage transformer also provides three gain stages for the voltage signal. The voltage transformer is set for a voltage gain of 1.2, 2.4, and 4.8. These gain settings will allow for nominal output voltage ranges of 0 to 120 volts, 120 to 240 volts and 240 to 480 volts. The resolution for these ranges is 31.24 millivolts for 0 to 120 volts, 62.5 millivolts for 120 to 240 volts and 125 millivolts for the 240 to 480 volt range. The range setting of the voltage transformer is controlled by the computer 12.

The current amplifier 90 creates a precise current that is representative of the current waveform signal from the synthesizer 98. The current amplifier has three output ranges 0 to 0.555 amps, 0 to 1.111 amps and 0 to 1.666 amps depending on the number of output current elements 104 energized. The current amplifier is capable of a peak output voltage of 155 volts. The output stage of the current amplifier is made up of multiple power MOSFET transistors to provide the power for the output current. The current amplifier also incorporates fold-over current limiting to provide against overloads and short circuits.

The current amplifier 90 is connected to the three current isolation and gain transformers 106. The current isolation and gain transformers 106 also contain the current ranging and output control that sets which of the three current elements 104 should be energized. This control information is received from the computer 12. The current ranging control will properly connect the current isolation transformers to the current amplifier to provide a current output on each element 104 of 0 to 50 amps in 12.5 milliamp steps. Each of the three output currents 104 has a minimum drive voltage of 1 volt. The three current transformers are made up of multiple cores and windings that are used together with electronic feedback to eliminate gain and phase errors in the output currents 104.

The reference standard 108 is connected with the same voltage 100 and current 104 signals as the energy meter being tested. Because the reference and energy meter being tested see the same voltage and current the information collected by the computer 12 from the reference and energy meter being tested can be used to determine test results. Suitable reference standards would include the RM-10 from Radian Research or the SC-30 from Scientific Columbus, although there are many others.

The analog I/O 110 in FIG. 5 is capable of producing and receiving a 0–20 mA DC current signal through connectors 112. The output current signal can be set by the computer 12 for any current value between 0 and 20 milliamps in 4.9 microamp steps for calibrating and testing current loop instrumentation. The current inside of connectors 112 is used for receiving a measuring current from current loop instrumentation. The input current first goes through a programmable gain amplifier with five gain ranges and is then measured by the computer 12 with a 12 bit analog to digital converter (ADC). The programmable gain amplifier is used to provide the ADC with the highest signal possible for greater resolution.

The analog I/O 110 is also capable of measuring the AC voltage 100 and current 104 signals to determine the voltage gain, current gain and phase angle. This information is used so that the computer 12 can self-test all of the critical signals of the invention. This same setup allows the invention to measure the voltage, current and phase angle of external sources.

The digital I/O 114 in FIG. 5 is used to collect information from the reference standard 108 and from the energy meter being tested. The digital I/O consists of four 40 bit counters, a programmable divider, external gate control, six KYZ pulse inputs, a programmable KYZ output, an open-collector type output, a high frequency input and a universal input used for photo pickups, disk edge pickups and hand switches. All of the outputs from the digital I/O 114 can be programmed for both count and frequency. The digital I/O 114 can be accessed through the digital I/O connectors 116.

The test system 10 eliminates the need for a test technician to carry additional equipment to measure the service phase angle, voltage and current. The invention features the ability to measure and electronically record the voltage, current and phase angle between voltage and current of a utility service.

Complex power grids and power interchange points between electric utilities must also be metered and controlled. These metering sites often contain other types of metering devices such as transducers, pulse recorders and panel meters. Each of these devices require a different and separate piece of equipment for certification, calibration or alignment; and in the case of the pulse recorder no known portable equipment is available to perform the certification test. Transducers are electronic devices that provide an analog output, usually a current loop, that is proportional to the measured quantity which may be volts, amps, watts, vars, phase angle, etc. These current loop outputs are generally used in the control circuits of electrical grid management systems providing for the monitoring of activity and possible problems on the grid. The outputs of these devices must be manipulated in order that certain trip and alarm points can be set in the management system.

The test system 10 provides for the input of analog signals from these devices and will perform verification and calibration tests automatically. The test system 10 generates a precision analog output which is used for manipulating the control current loops so that trip and alarm points may be accurately adjusted. The invention also generates 2 and 3 wire KYZ pulses for testing pulse recorders, either by transmitting continuously or in a batch mode of a predetermined number.

The test system 10 also provides for quick and easy verification of the reference standard 108 without removing it from the test system 10. Furthermore, the test system 10 provides for automatic and transparent checking to verify the accuracy of the reference standard 108, voltage source, and current source during the actual testing process.

The test system 10 is able to test other power quantities such as VAR, KVA, Q, $V^2h$, $I^2h$ as both received and delivered. The test system 10 is designed to accept a number of different reference standards having the measurement capability for other power quantities. The test system 10 will perform tests on any power quantity that the reference standard is capable of measuring.

The test system 10 features solid state sources to generate voltage current and phase angle similar to calibration laboratory equipment. These sources provide pure waveforms free of amplitude variation, phase variation, noise and distortion, thereby removing the energy meter completely from the influence of the service voltage. These pure waveforms virtually eliminate the differences between laboratory and on site method testing. The test system 10 will obtain similar test results on the same meter regardless of whether laboratory or site testing occurs. Further, the new, more accurate class of energy meter can be tested on site as well as at the calibration laboratory. As to errors caused by residual magnetism, the applied power source is ramped up and down at the beginning and the end of testing.

There are also problems associated with using the service voltage to run a test system. There are two types of metering services. Those which are self-contained (the energy meter is connected directly to the service wires and experiences the full voltage and current available in the service), and those which are transformer rated (the energy meter is connected to the secondary of step-down transformers and experiences only a fraction of the voltage and current available in the service).

The transformer rated service is fitted with a precision voltage transformer that reduces the service voltage usually to a level of 120 volts. This precision instrument transformer has a limited secondary current compliance to maintain its accuracy class and is normally sized to supply an accurate voltage transfer to the metering elements in the installation. Because the secondary of this precision instrument transformer is typically the only low voltage available to the calibration technician at the service, the testing equipment is normally powered from this source. Existing testing equipment designs require several amperes of current, the value depending on the load current supplied by the equipment. The precision instrument transformer compliance is not generally large enough to supply this current and the secondary voltage drops. This drop in voltage across the voltage coil of the electricity meter causes large measuring errors which result in poor test results.

To eliminate this problem, the test system 10 generates its own current and voltage waveforms. The test system 10 utilizes a power factor correction of the auxiliary power supply which reduces the peak current demand and line harmonic generation resulting in lower line current requirements and greatly reduced harmonic pollution of the supply source.

Since many voltage levels ranging from 120 to 480 volts are encountered when testing an energy meter at the operational site, current test equipment may be fitted with a selector switch to match the voltage level of the system to the service which protects the test equipment from accidental burnout. If the applied service voltage exceeds the voltage level selected on the equipment permanent damage or burnout may occur. This damage can occur as a result of an error made by a test technician when selecting the operating voltage or occur during a voltage transient from the service voltage. This type of damage can cause lost test time and capital equipment repair cost.

Furthermore, the current use of step-down transformers rarely provide the sufficient power required by many energy meter test systems. Insufficient power can cause poor test results.

Generally, power supplies using a service voltage, or off line power supplies, may be divided into two distinct categories: linear or switch mode.

Usually, linear power supplies that are designed for off-line applications use a low frequency, 50 or 60 hertz transformer to step up or down the input voltage to the necessary output voltage. These low frequency transformers have many deficiencies that limit the linear power supply capabilities for off-line applications which require a wide dynamic input range.

The main disadvantage of low frequency input transformers is that their output voltage is proportional to the input voltage and is fixed by the turns ratio of the transformer. However, many different outputs may be needed. To solve this problem, a single transformer may be tapped in several places thereby achieving a different ratio, and a different output voltage, at each tap. In this case, A manual range selection switch may be employed to select a voltage. This method requires the technician to choose the correct voltage or else risk damage to the system or injury to the technician.

Another way of selecting the proper input tap, auto-ranging, is to utilize circuitry to automatically set the proper tap before the supply is energized. However, random voltage range changes may occur during high or low line conditions and change the output voltage. Further, the input voltage is still limited to the voltages depending on the transformer taps.

Due to the limited input ranges, and to the expensive cost, large size and weight of low frequency transformers, linear power supplies are for the most part not practical for off-line power supplies that require a wide dynamic input range.

Switch mode power supplies, on the other hand, do not utilize low frequency transformers and are thus not limited to the same input restrictions of linear power supplies.

Over the past few years most high quality switch mode power supplies have evolved from single stage converter to multiple stage converters. In a single stage design the AC mains are directly rectified and connected to large input capacitors to provide input storage. The switch mode converter then operates off of the DC bus voltage provided by the large storage capacitors.

Due to the nature of the switch mode supplies, the input voltage can usually vary by more than 20% and still provide output regulation over the specified load. However, like the linear supply, there are still a limited number of input ranges. Furthermore, for wider input ranges a low frequency transformer might be needed.

In a multiple stage switch mode converter the input stage is a complete switch mode converter known as a pre-regulator operating independently of the output converter. The most common type of converter used for the pre-regulator is the boost converter. Switching at a frequency that is much higher than the line frequency, the pre-regulator is designed to draw a sinusoidal input current that is in phase with the input voltage. The pre-regulator will then crudely regulate the bus voltage on the storage capacitor for the second converter stage to work from.

Using a pre-regulator as the input stage of a multiple stage converter eliminates several disadvantages of linear and single stage switchers. The power factor is improved from 0.95 to 0.999 and because the second stage is working off of a constant input voltage, the pre-regulator need only control a changing input voltage.

This type of two stage switching converter is widely accepted and used today for universal input supplies that are capable of operating off of any input voltage from 80 up to 270 volts AC. The 80 to 270 volts range is wide enough for the majority of off-line power supply requirements. However, requirements exist, especially in the Electric Utility Industry, for a power supply to be able operate from an input range of 80 to 530 volts. At the higher boost output voltages, the two stage switching converter power supply shows a reduction in the current carrying capability limiting the supply to a few hundred watts of power. To overcome these deficiencies, the test system 10 utilizes multiple switching devices with staggered drive signals.

Figure 6:
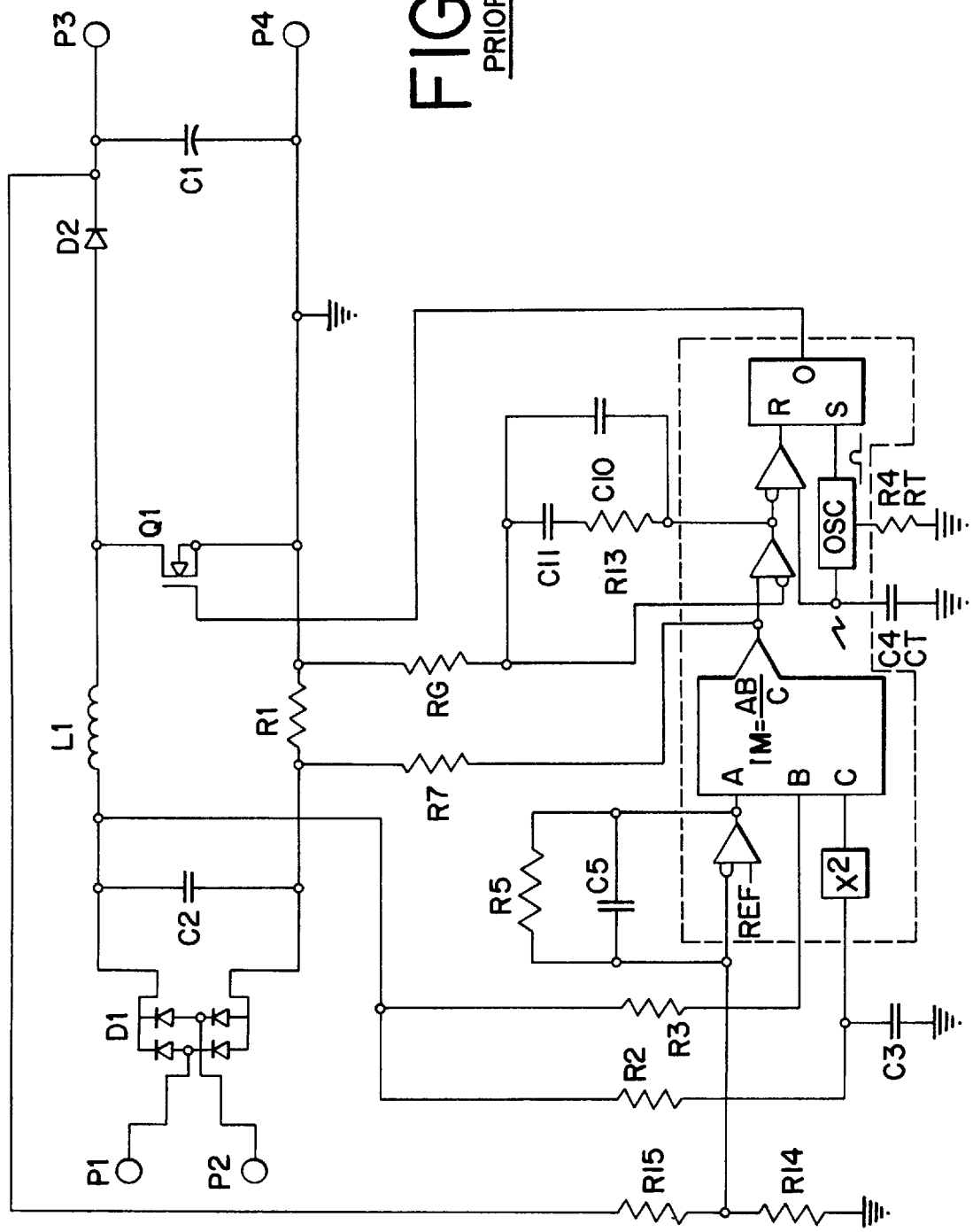
FIG. 6 illustrates a schematic of a power factor corrected, universal input pre-regulator.

The circuit diagram of FIG. 6 shows a typical application of a power factor corrected, universal input pre-regulator. The circuit consists of two distinct parts, the power section and the control section.

The power section of the circuit is that of a typical DC to DC boost converter. The AC input voltage is connected to terminal P1 and P2 and then rectifier D1 produces a direct current output voltage. Capacitor C2 in the circuit is used for noise control, there is no large storage capacitor normally associated with the AC to DC conversion function. Inductor L1, transistor switch Q1, diode D2 and capacitor C1 make up the boost converter. The output of the pre-regulator is on P3 and P4.

The control section is centered around a power factor control circuit that must control both the input current and the output voltage. The controller has an inner current loop that is programmed by the rectified line voltage through R3 so that the converter will appear to be resistive to the line. The controller regulates the output voltage by changing the average amplitude of the current programming signal. Output voltage is monitored by the resistor divider made up of R15 and R14.

Although the output of the pre-regulator is a constant voltage, because of the controller the power that flows into the output capacitor C1 is actually a sine wave at twice the line frequency.

The circuitry and components of the control section described above form a typical prior art power factor corrected pre-regulator which would be readily understood by one having ordinary skill in the art.

Because the boost topology dictates that the output voltage must be higher than the peak of the input voltage, typical pre-regulator designs set the output voltage to about 380 to 400 volts DC. This level is high enough to handle an AC input voltage as high as around 270 volts RMS or a peak voltage of 382 volts.

The main limitation of the circuit shown in FIG. 6 and similar circuits which can allow higher input voltages is the power switch. In order for the supply to operate in the 500–600 voltage input range, the boost voltage must be greater than the highest peak voltage of the line, well over 700 volts.

Although there are power switches such as MOSFETs rated for high voltage, as the voltage capability of these switches MOSFET increase the on channel resistance also increases. Although high voltage MOSFETs work fine in low power systems, in high power systems the increased current at low line voltage causes an unacceptable high power loss in the MOSFET.

Other devices such as bipolar junction transistors and insulated gate bipolar transistors (IGBTs) are also capable of switching in such high voltage environments, but slow switching speeds create power losses which renders these switches an unacceptable alternative.

Figure 7:
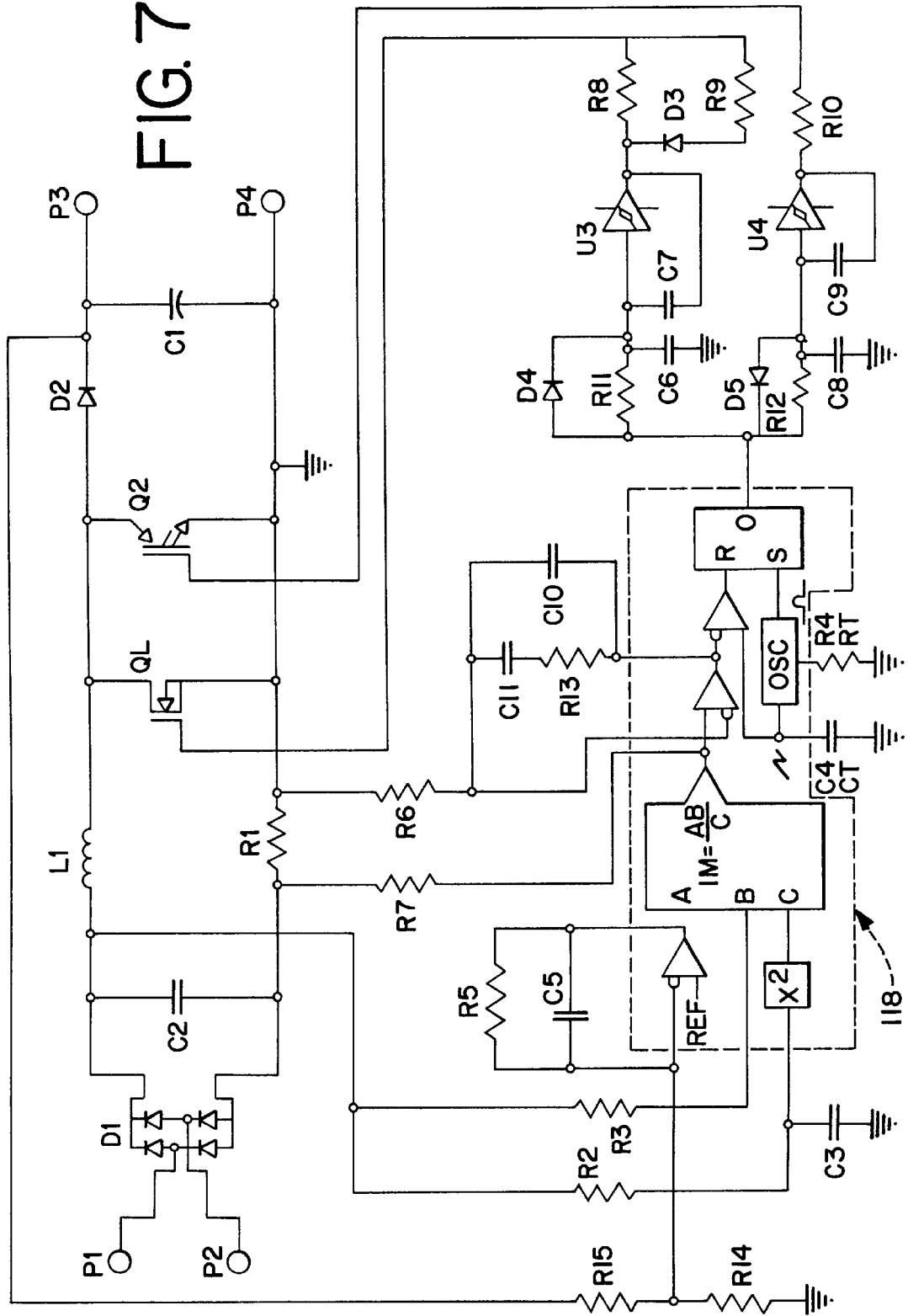
FIG. 7 illustrates a schematic of a multiple stage switch mode converter power supply of the energy meter test system according to the present invention.

The circuit in FIG. 7 illustrates a multiple stage switch mode converter of the present invention. By using multiple switching devices the overall goal of high power and a wide input range can be achieved.

MOSFET Q1 is used to switch the supply between conducting and non-conducting states. Because of the fast rise and fall times of MOSFETs the losses due to switching the load are kept to a minimum. A short time after MOSFET Q1 switches the load into the conducting state, about 100 ns, IGBT Q2 is turned on. Because the on state collector to emitter voltage drop of the IGBT is much lower than the voltage that would be developed across the MOSFET at low line voltage due to the $I^2R$ drop, the IGBT will carry the majority of the load current. At the end of the conducting period IGBT Q2 is turned off and the entire load current passes through MOSFET Q1. After about 1 us when the IGBT has completely stopped conducting, MOSFET Q1 is turned off and the switch is in the non-conducting state.

The switch made up of Q1 and Q2 is controlled by a staggered gate drive circuit that receives its control from the power factor control IC 118.

The drive section for the MOSFET Q1 is made up of D4, R11, C6, C7, U3, R8, D3, and R9. The turn on signal from the control IC 118 bypasses the time delay circuit made up of R11, C6 and through D4 is directly connected to the input of amplifier U3. Amplifier U3 turns on MOSFET Q1 through the current limiting resistor R8. Resistor R8 slows down the turn of time of the MOSFET just enough to overcome the reverse recovery time of boost diode D2. At time of turn off, diode D4 is reversed biased and R11 and C6 generate the required time delay. Capacitor C7 provides positive feedback to the amplifier for added noise immunity. Because at turn off the reverse recovery of D2 is not a concern diode D3 and resistor R9 form a speed up circuit around resistor R8 to decrease the turn off time of Q1. Resistor R9 is provided to eliminate oscillations at the gate of Q1.

The drive circuit for IGBT Q2 operates in much the same way as the MOSFET driver only in reverse. At time of turn on D5 is reversed biased and R12 and C8 form a time delay circuit allowing for the MOSFET to turn on first. At turn off the delay is bypassed by D5 and Q2 turns off before Q1 due to the time delay in the MOSFET gate drive circuit.

Figure 8:
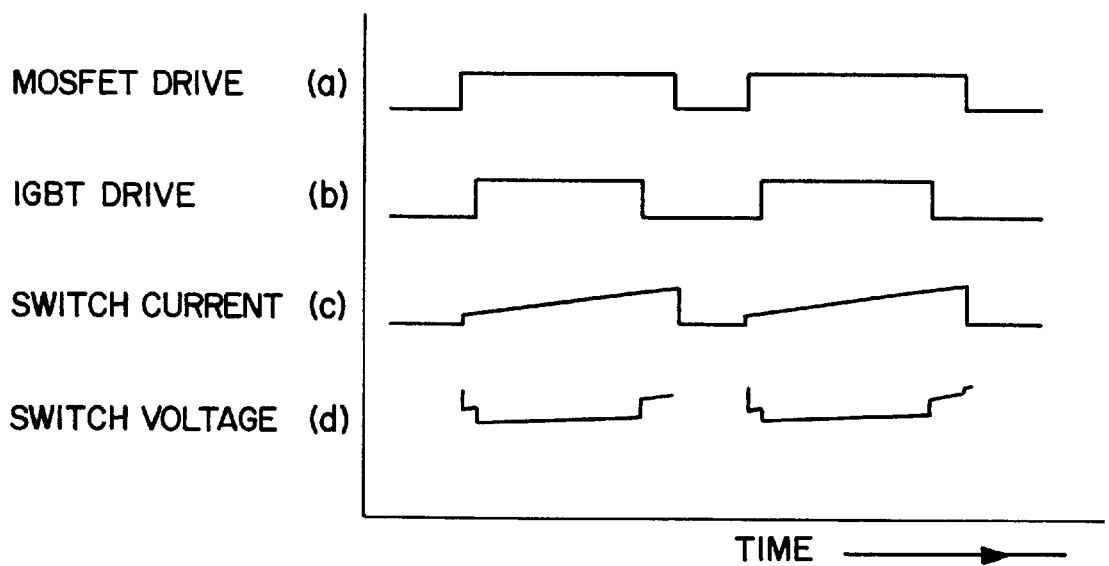
FIGS. 8a through 8d illustrate certain drive signals and waveforms associated with the energy meter test system according to the present invention.

The staggered gate drive signals produced by the drive circuit can be seen in FIGS. 8*a* and 8*b*. FIG. 8*c* shows a waveform of the current in the power switch made up of the MOSFET and the IGBT. The ramp in the current wave form is caused by increasing inductor current in L1 over time. The voltage drop across the power switch during the conducting period is shown in FIG. 8*d*.

Several other possible switch configurations will allow for a high switch voltage with high power capability at low input line voltage.

Figure 9A:
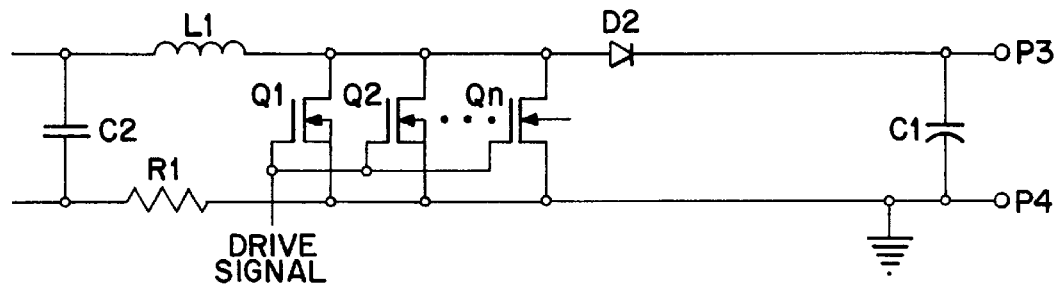
FIGS. 9a through 9d illustrate alternative embodiments to the multiple stage switch mode converter power supply of FIG. 7.

To avoid the problem of diminishing current carrying capability at higher voltage ratings when using MOSFETs as the power switch, multiple MOSFETs may be connected in parallel. FIG. 9*a* illustrates an example of multiple MOSFETs connected in parallel.

Figure 9B:
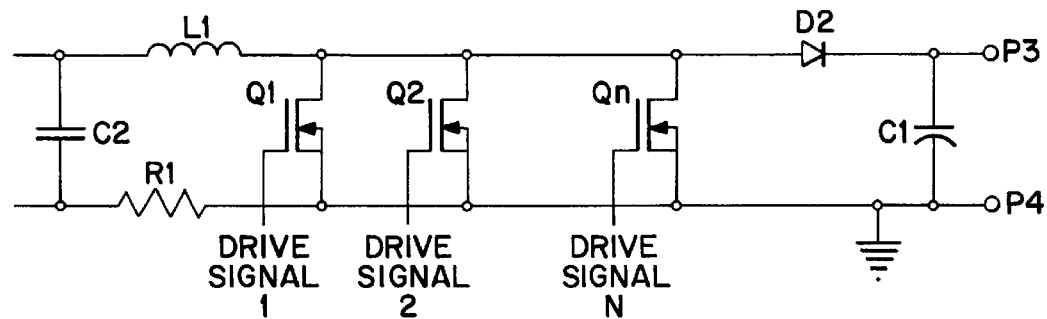

FIG. 9*b* illustrates another possible solution using multiple MOSFETs in a scanning configuration for the power switch. Here, using n different MOSFETs connected in parallel, the drive signal coming from the power control IC would be divided up n times and then the multiple drive signals would be connected to the n different MOSFETs. Each MOSFET would only have 1/n of the total loss.

Figure 9C:
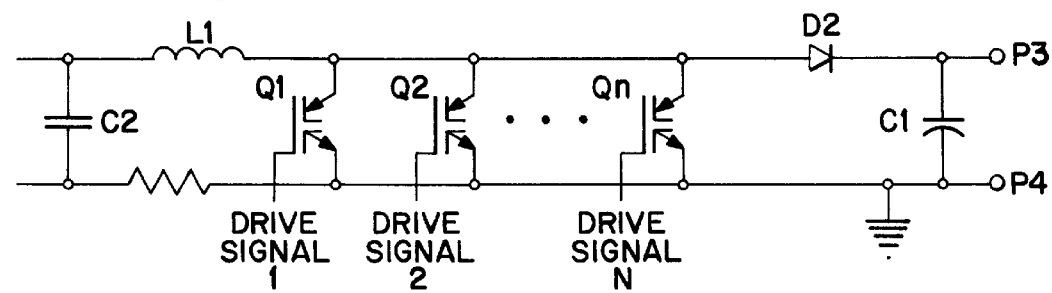

Because of their low conducting losses, IGBTs can be used for the power switch. However, the slow switching speeds of IGBTs would prohibit the system to operate at a high enough frequency for adequate performance. Replacing MOSFETs as shown in FIG. 9*c* in the above example with IGBTs and using multiple drive circuits would reduce switching losses.

Figure 9D:
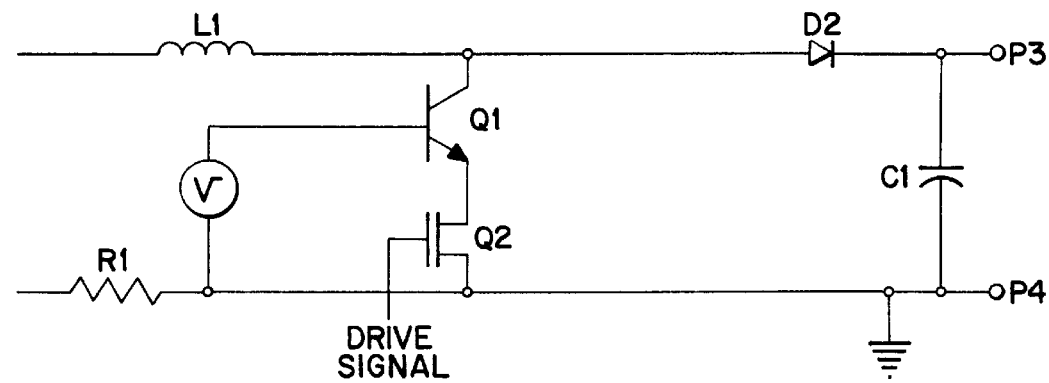

Also a high voltage bipolar transistor could be utilized by placing a low voltage MOSFET in the emitter of the bipolar transistor to form a cascode connection. This combination, as shown in FIG. 9d will have a much faster switching speed than that of a bipolar transistor alone.

It is to be understood that the form of this invention is merely a preferred embodiment. Various changes may be made in the function and arrangement of parts; equivalent means may be substituted for those illustrated and described; and certain features may be used independently from others without departing from the spirit and scope of the invention as defined in the following claims.

What is claimed is:

1. A portable electrical meter tester for testing electrical metering devices at a test site, where the test site includes a current source and/or a voltage source, the electrical metering device being connected with the current source and/or the voltage source of the test site, the portable electrical meter tester comprising:

measurement circuitry to determine the accuracy of the electrical metering device;

terminals connected to the measurement circuitry that releasably connect the electrical meter tester to the electrical metering device; and circuitry connected to the terminals to monitor for back feed voltage, where the circuitry electrically isolates the electrical meter tester from the current source and the voltage source of the test site if back feed voltage is detected and connects the electrical meter tester to the test site when no back feed voltage is detected.

2. The portable electrical meter tester of claim 1 further including a processor, where the processor checks the circuitry for back feed voltage to connect the electrical meter tester to the test site only when the circuitry detects no back feed voltage.

3. The portable electrical meter tester of claim 1, wherein the circuitry comprises at least one high impedance element to prevent current flow upon detection of back feed voltage.

4. The portable electrical meter tester of claim 3 wherein the high impedance element comprises a relay.

5. The portable electrical meter tester of claim 1, wherein the circuitry notifies a user of back feed voltage connected to the terminals.

* * * * *